(12) United States Patent
Wan et al.

(10) Patent No.: US 10,310,647 B2
(45) Date of Patent: Jun. 4, 2019

(54) TOUCH-CONTROLLED PANEL, METHOD OF MANUFACTURING THE SAME, AND DISPLAY DEVICE

(71) Applicants: BOE Technology Group Co., Ltd., Beijing (CN); Hefei Xinsheng Optoelectronics Technology Co., Ltd., Anhui (CN)

(72) Inventors: Yunhai Wan, Beijing (CN); Wenlong Wang, Beijing (CN); Tao Ma, Beijing (CN); Binbin Cao, Beijing (CN); Chengshao Yang, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 374 days.

(21) Appl. No.: 15/232,949

(22) Filed: Aug. 10, 2016

(65) Prior Publication Data

US 2017/0199615 A1    Jul. 13, 2017

(30) Foreign Application Priority Data

Jan. 11, 2016   (CN) .......................... 2016 1 0016241

(51) Int. Cl.
*H01L 27/12* (2006.01)
*G06F 3/041* (2006.01)
*G06F 3/044* (2006.01)

(52) U.S. Cl.
CPC ............ *G06F 3/0412* (2013.01); *G06F 3/044* (2013.01); *H01L 27/1288* (2013.01); *G06F 2203/04103* (2013.01); *G06F 2203/04111* (2013.01)

(58) Field of Classification Search
CPC .................................................. H01L 27/1288
See application file for complete search history.

(56) References Cited

U.S. PATENT DOCUMENTS 8,298,728 B2 * 10/2012 Piao .......................... G03F 1/50
430/5
2012/0081300 A1    4/2012 Chan et al.
(Continued)

FOREIGN PATENT DOCUMENTS

CN    102681714 A    9/2012
CN    104216562 A    12/2014
(Continued)

OTHER PUBLICATIONS

First Office Action from Chinese Patent Application No. 201610016241.4, dated Jan. 31, 2018, 12 pages.

*Primary Examiner* — Yu-Hsi D Sun
(74) *Attorney, Agent, or Firm* — Westman, Champlin & Koehler, P.A.

(57) ABSTRACT

Embodiments of the present invention discloses a touch-controlled panel and a method of manufacturing the same, and a display device, to reduce the number of masks and production cost. The method of manufacturing a touch-controlled panel includes: forming a first electrode and a second electrode on a substrate through a patterning process, the first electrode and the second electrode being broken at a position where they are overlapped; depositing a layer of an organic film and forming an organic film fully remained region, an organic film partially remained region and an organic film removed region from the organic film through a mask; depositing a conductive layer and coating a photoresist on the conductive layer, and then forming a photoresist fully remained region, a photoresist partially remained region and a photoresist removed region through the mask.

8 Claims, 5 Drawing Sheets

(56) References Cited

U.S. PATENT DOCUMENTS

2016/0253027 A1 9/2016 Choi et al.
2016/0300866 A1* 10/2016 Long .................. H01L 21/77

FOREIGN PATENT DOCUMENTS

CN 104576527 A 4/2015
CN 104699336 A 6/2015

* cited by examiner

TOUCH-CONTROLLED PANEL, METHOD OF MANUFACTURING THE SAME, AND DISPLAY DEVICE

CROSS-REFERENCE TO RELATED APPLICATION

This application claims the benefit of Chinese Patent Application No. 201610016241.4 filed on Jan. 11, 2016 in the State Intellectual Property Office of China, the whole disclosure of which is incorporated herein by reference.

TECHNICAL FIELD

Embodiments of the present invention relates to display technical field, and particularly to a touch-controlled panel and a method of manufacturing the same, and a display device.

BACKGROUND

In display technical field, a range of application of a touch-controlled panel becomes increasingly wide, and the touch-controlled panel is developing rapidly particularly in consumption electronic product field, such as panel computer, smart mobile phone and the like. A conventional touch-controlled panel mainly includes resistance-type and capacitance-type touch-controlled panels according to its operation principle. The capacitive touch-controlled panel gradually becomes prevalent in the market due to quick response, multipoint touch control, long lifetime and the like.

The capacitive touch-controlled panel includes a surface capacitive touch-controlled panel and a projected capacitive touch-controlled panel. The projected capacitive touch-controlled panel is widely used currently. The projected capacitive touch-controlled panel is generally composed of a plurality of first electrodes and a plurality of second electrodes having a touch-controlled function and arranged in a touch-controlled region of the substrate. The first electrodes and the second electrodes may be arranged in different layers, or may be arranged in the same layer. If the first electrodes and the second electrodes are arranged in the same layer, the first electrodes and the second electrodes are broken and are connected through a bridging connection layer at a position where they are overlapped.

In sum, when manufacturing a conventional touch-controlled panel, the films need to be processed through respective masks, so more masks are needed, which renders high cost.

SUMMARY

Embodiments of the present invention provide a touch-controlled panel and a method of manufacturing the same and a display device, which reduces use of masks, increases production cost and simplifies production process. (建议删除)

An embodiment of the present invention provides a method of manufacturing a touch-controlled panel, the method including:

forming a first electrode and a second electrode on a substrate through a patterning process, the first electrode and the second electrode being broken at a position where they are overlapped;

depositing a layer of an organic film and forming an organic film fully remained region, an organic film partially remained region and an organic film removed region from the organic film through a mask, wherein the organic film removed region corresponds to a region where a bridging connection layer provided in a subsequent step is in contact with the first electrode or the second electrode, the organic film partially remained region corresponds to a region where the bridging connection layer will be provided in a subsequent step, and a portion of the organic film corrsponding to the organic film fully remained region and the organic film partially remained region constitutes a first organic film;

depositing a conductive layer and coating a photoresist on the conductive layer, and then forming a photoresist fully remained region, a photoresist partially remained region and a photoresist removed region through the mask, wherein the photoresist fully remained region corresponds to a region where the conductive layer is in contact with the first electrode or the second electrode, and the photoresist partially remained region corresponds to the region where the bridging connection layer will be provided;

etching the substrate where the above steps have been finished, and removing the residual photoresist, so as to form the bridging connection layer.

According to an embodiment, the first electrode and the second electrode are transparent electrodes; or, the first electrode and the second electrode are metal electrodes.

According to an embodiment, the conductive layer is a transparent conductive layer; or, the conductive layer is a metal conductive layer.

According to an embodiment, the substrate is a substrate of an array substrate;

in a situation where the first electrode and the second electrode are transparent electrodes, the first electrode and the second electrode are formed in the same layer as a pixel electrode, or are formed in the same layer as a common electrode;

in a situation where the first electrode and the second electrode are metal electrodes, the first electrode and the second electrode are formed in the same layer as a gate electrode, or are formed in the same layer as source and drain electrodes.

According to an embodiment, the substrate is a substrate of an array substrate;

in a situation where the conductive layer is a transparent conductive layer, the conductive layer is formed in the same layer as a pixel electrode, or is formed in the same layer as a common electrode;

in a situation where the conductive layer is a metal conductive layer, the conductive layer is formed in the same layer as a gate electrode, or is formed in the same layer as source and drain electrodes.

According to an embodiment, the organic film is formed of a negative photoresist and the photoresist is a positive photoresist; or, the organic film is formed of a positive photoresist and the photoresist is a negative photoresist.

According to an embodiment, the mask is a gray-tone mask or a half-tone mask.

According to an embodiment, the method further comprises: forming a second organic film, through a patterning process, on the substrate, on which the first organic film and the bridging connection layer have been formed.

An embodiment further provides a touch-controlled panel, which is formed by using the method as mentioned above.

An embodiment further provides a display device comprising the touch-controlled panel as mentioned above.

DETAILED DESCRIPTION OF THE EMBODIMENTS

Embodiments of the present invention provide a touch-controlled panel and a method of manufacturing the same and a display device, to reduce usage of a mask, reduce producing cost and simplify manufacturing process.

In order to make object, technical scheme and advantages of the present invention be clear, further description in detailed will be made to the present invention in conjunction with the drawings. Obviously, the embodiments described below are only a part of the embodiments of the present invention, instead of the entire. Based on the embodiments in the specification, other embodiments that may be obtained by those skilled in the art without inventive labor belong to scope of the present invention.

A method of manufacturing a touch-controlled panel provided by embodiments of the present invention is described in detailed in conjunction with the drawings.

Figure 1:
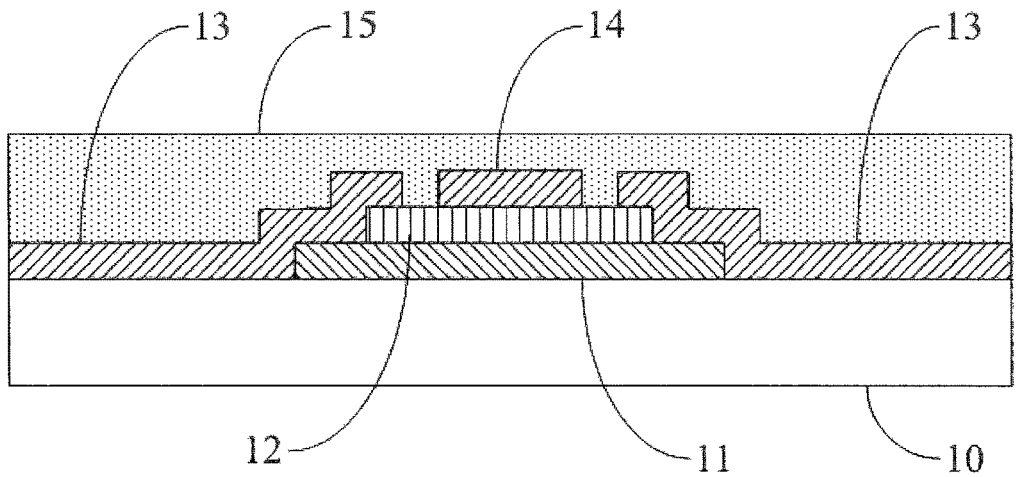
FIG. 1 is a schematic cross section view of a touch-controlled panel in related art.

FIG. 1 illustrates a structure of a projected capacitive touch-controlled panel in related art. Specifically, when manufacturing the touch-controlled panel, a bridging connection layer 11 is firstly manufactured on a substrate 10; a first organic film 12 is then formed on the bridging connection layer 11, the first organic film 12 covering part of the bridging connection layer 11, instead of covering the entire bridging connection layer 11; subsequently, a first electrode 13 and a second electrode 14 are formed on the first organic film 12, the first electrode 13 and the second electrode 14 being located in the same layer and the first electrode 13 and the second electrode 14 being separated at a boundary between them by the first organic film 12 and portions of the first electrode 13 being connected with one another by the bridging connection layer 11; finally, a second organic film 15 is formed on the first electrode 13 and the second electrode 14, for protecting the films below it. During manufacturing, the bridging connection layer 11, the first organic film 12, the first electrode 13 and the second electrode 14 are manufactured through respective particular masks, which results in an increased number of masks in the process of manufacture.

Figure 2:
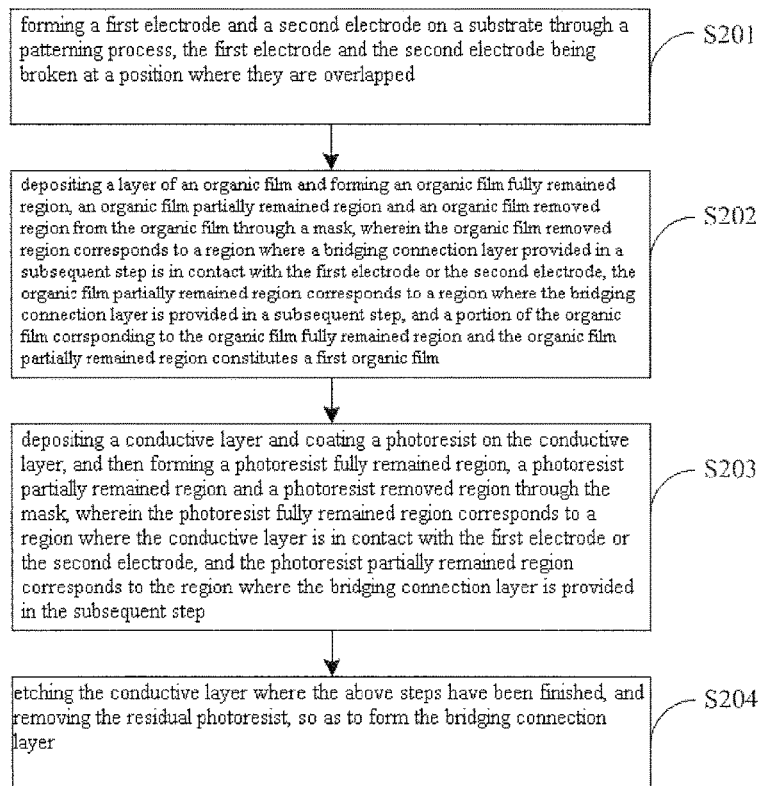
FIG. 2 is a flow chart of a method of manufacturing a touch-controlled panel according to an embodiment of the present invention.

As shown in FIG. 2, embodiments of the present invention provide a method of manufacturing a touch-controlled panel. The method includes:

a step S201 of forming a first electrode and a second electrode on a substrate through a patterning process, the first electrode and the second electrode being broken at a position where they are overlapped;

a step S202 of depositing a layer of an organic film and forming an organic film fully remained region, an organic film partially remained region and an organic film removed region from the organic film through a mask, wherein the organic film removed region corresponds to a region where a bridging connection layer provided in a subsequent step is in contact with the first electrode or the second electrode, the organic film partially remained region corresponds to a region where the bridging connection layer is provided in a subsequent step, and a portion of the organic film corrspond-ing to the organic film fully remained region and the organic film partially remained region constitutes a first organic film;

a step S203 of depositing a conductive layer and coating a photoresist on the conductive layer, and then forming a photoresist fully remained region, a photoresist partially remained region and a photoresist removed region through the mask, wherein the photoresist fully remained region corresponds to a region where the conductive layer is in contact with the first electrode or the second electrode, and the photoresist partially remained region corresponds to the region where the bridging connection layer is provided in the subsequent step;

S204: etching the conductive layer where the above steps have been fmished, and removing the residual photoresist, so as to form the bridging connection layer.

The process of manufacturing the touch-controlled panel will be described in detailed through the following embodiments of the present invention in conjunction with the drawings, in which thicknesses of films and shapes and sizes of various regions as shown in drawings do not reflect a real scale of the touch-controlled panel, but are intended to schematically illustrate the content of the present invention.

Figure 3:
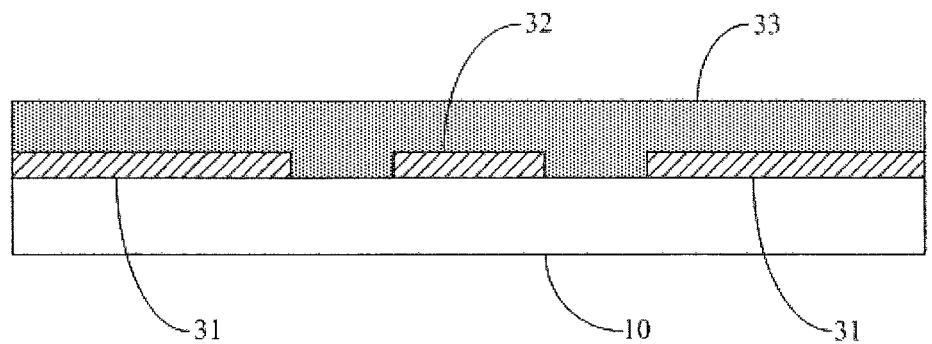
FIGS. 3-10 are schematic structural cross section views in different stages during manufacturing a touch-controlled panel according to an embodiment of the present invention.

As shown in FIG. 3, a first electrode 31 and a second electrode 32 are firstly formed on a substrate 10 through a patterning process. The substrate 10 in the embodiment of the present invention may be a glass substrate, or may be a flexible substrate, or may be other type of substrate, and is not limited here. The patterning process in the embodiment of the present invention includes a part of a process of or the entire process of coating, exposure, and development of photoresist, etching and removement of the photoresist. The first electrode 31 and the second electrode 32 formed are broken at the position where they are overlapped. Then, the layer of the organic film 33 is deposited on the substrate, on which the first electrode 31 and the second electrode 32 have been formed.

Specifically, the first electrode 31 and the second electrode 32 in the embodiment of the present invention may be a transparent electrode. For example, the first electrode 31 and the second electrode 32 in the embodiment of the present invention may be a single layer of indium tin oxide (ITO) film, or a single layer of indium zinc oxide (IZO) film, or a composite film of the ITO and IZO. Of course, in practice, other type of transparent conductive film may be used. In a situation where the substrate 10 in the embodiment of the present invention is a substrate of an array substrate, the first electrode 31 and the second electrode 32 may be formed in the same layer as a pixel electrode, or may be formed in the same layer as a common electrode, or may be formed from a transparent conductive layer that is seperately deposited. When the first electrode 31 and the second electrode 32 are formed in the same layer as the pixel electrode or the common electrode, the steps may be saved and product cost may be reduced.

The substrate 10 in the embodiment of the present invention may be formed as a substrate of a color filter substrate. In this instance, the first electrode and the second electrode may be formed from a transparent conductive layer that is seperately deposited. The specific process of manufacturing the first electrode and the second electrode is similar to a conventional process and is not repeatedly described herein.

Specifically, the first electrode 31 and the second electrode 32 in the embodiment of the present invention may also be metal electrodes. For example, the first electrode 31 and the second electrode 32 in the embodiment of the present invention may be in the form of a single layer of film or composite film made of metal, such as, molybdenum (Mo), aluminium (Al) or the like. If the substrate 10 in the embodiment of the present invention is a substrate of an array substrate, the first electrode 31 and the second electrode 32 may be manufactured in the same layer as a gate electrode, or may be manufactured in the same layer as source and drain electrodes, or may be manufactured from a metal layer that is seperately deposited. In a situation where the first electrode 31 and the second electrode 32 is formed in the same layer as the gate electrode or the source and drain electrodes, manufacturing steps can be saved and produceion cost can be reduced.

The substrate 10 in the embodiment of the present invention may also be a substrate of a color filter substrate, and in this instance, the first electrode and the second electrode may be manufactured from a metal layer that is separately deposited. The specific process of manufacturing the first electrode and the second electrode is similar to a conventional process and is not repeatedly described herein.

Figure 4:
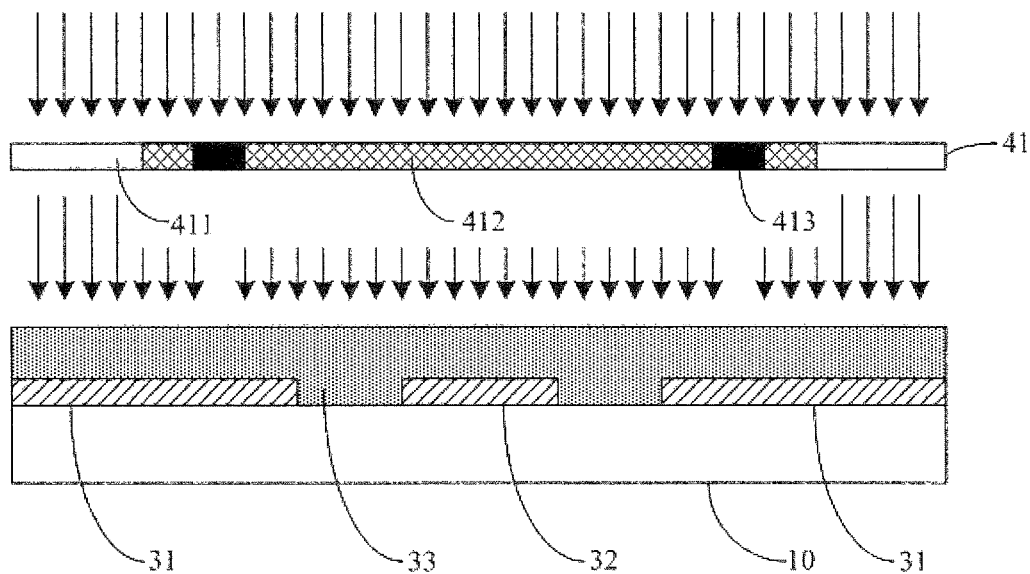

As shown in FIG. 4, after the organic film 33 is deposited, the organic film fully remained region, the organic film partially remained region and the organic film removed region are formed from the organic film through a mask 41. For example, the mask 41 in the embodiment of the present invention may be a gray-tone mask or a half-tone mask. The mask 41 may include a fully transparent region 411, a partially transparent region 412 and a fully opaque region 413. The embodiment is further described with reference to a partially transparent region 412 that transmits 50% of light. The direction indeicated by the arrow in Figure is a transmitting direction of the light.

Figure 5:
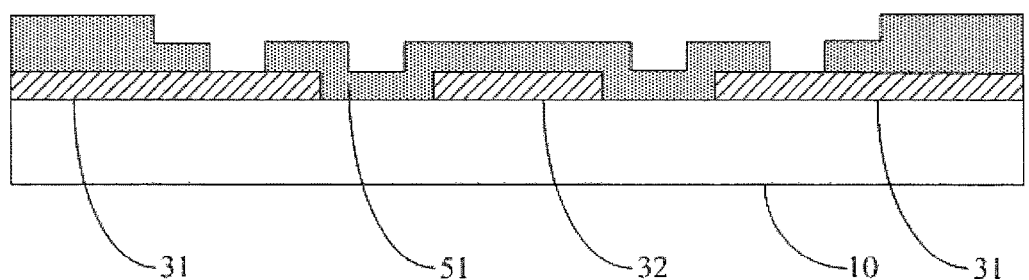

In an embodiment, the organic film 33 is a negative photoresist. A portion of negative photoresist, which is irradiated by light, is remained and a portion of the negative photoresist, which is not irradiated by light, is removed, during developement. As shown in FIG. 4, the organic film 33 is exposed by using the mask 41 and is developed, thereby obtaining the organic film fully remained region in a region corresponding to the fully transparent region 411 of the mask 41, the organic film partially remained region in a region corresponding to the partially transparent region 412 of the mask 41 and the organic film removed region in a region corresponding to the fully opaque region 413 of the mask 41. As shown in FIG. 5, a portion of the organic film corresponding to the organic film fully remained region and the organic film partially remained region constitutes a first organic film 51, the organic film removed region corresponds to a region where the bridging connection layer that is provided in a subsequent step is in contact with the first electrode 31, the organic film partially remained region corresponds to a region where the bridging connection layer will be formed in a subsequent step, and the organic film fully remained region corresponds to a region on the substrate where the retained organic film is needed. The region where the retained organic film is needed is set as required by a actual product.

Figure 6:
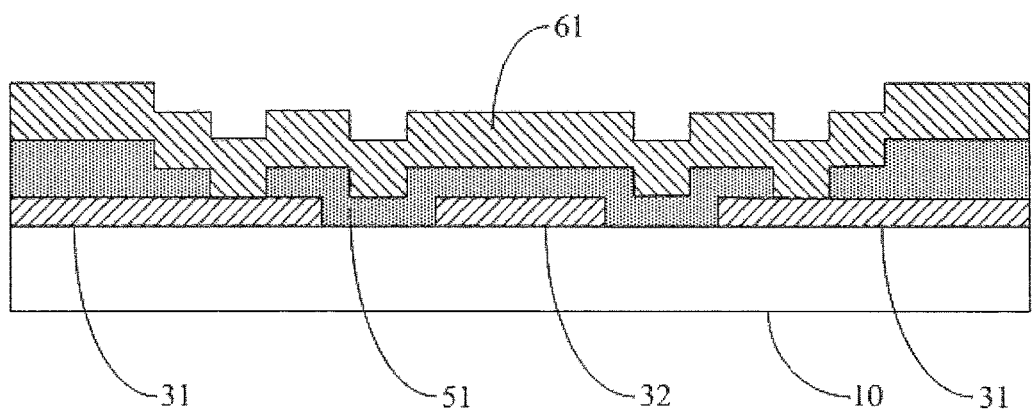

As shown in FIG. 6, a conductive layer 61 is deposited on the substrate, on which the first organic film 51 has been formed. In a specific implementation, the conductive layer 61 deposited in the embodiment of the present invention may be a transparent conductive layer. For example, the transparent conductive layer may be a single layer of film of ITO, or a single layer of film of IZO, or a composite film of the ITO and IZO. In a situation where the substrate 10 in the embodiment of the present invention is a substrate of an array substrate, the conductive layer 61 may be formed in the same layer as a pixel electrode, or may be formed in the same layer as a common electrode, or may be formed from a transparent conductive layer that is separately deposited. When the conductive layer 61 is formed in the same layer as the pixel electrode or the common electrode, the process steps can be saved and product cost can be reduced.

In a specific implementation, the conductive layer 61 deposited in the embodiment of the present invention may further be a metal conductive layer. For example, the conductive layer 61 in the embodiment may be in the form of a single layer of film or composite film made of metal, such as, molybdenum (Mo), aluminium (Al) or the like. If the substrate 10 in the embodiment of the present invention is a substrate of an array substrate, the conductive layer 61 may be manufactured in the same layer as a gate electrode, or may be manufactured in the same layer as source and drain electrodes, or may be manufactured from a metal layer that is separately deposited. In a situation where the conductive layer 61 is formed in the same layer as the gate electrode or the source and drain electrodes, manufacturing steps can be saved and production cost may be reduced.

Figure 7:
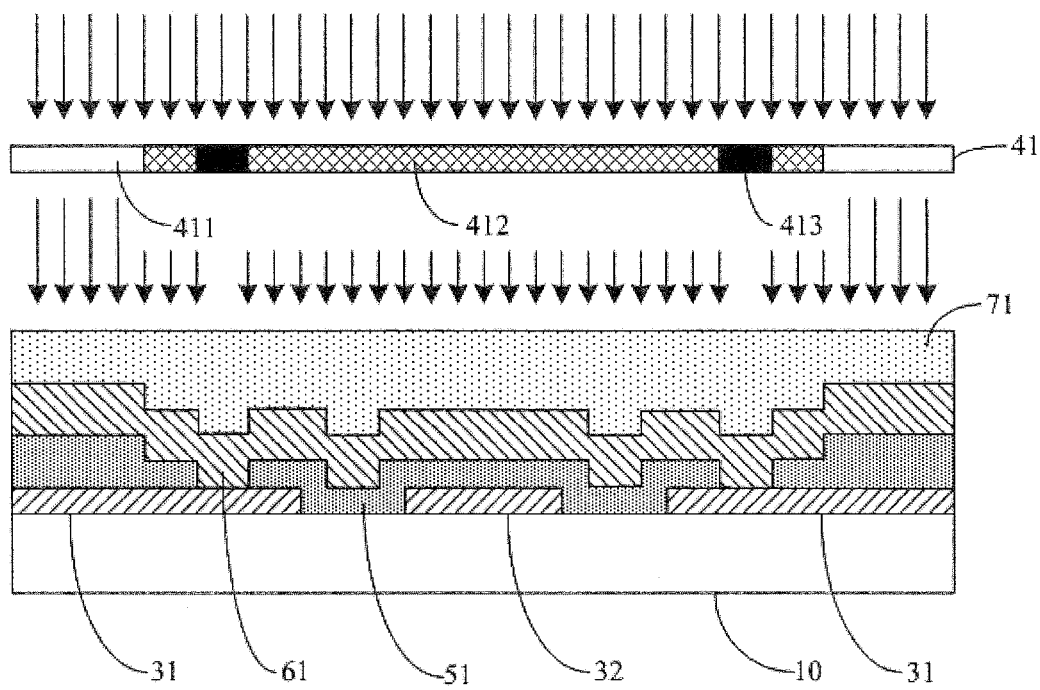
Figure 8:
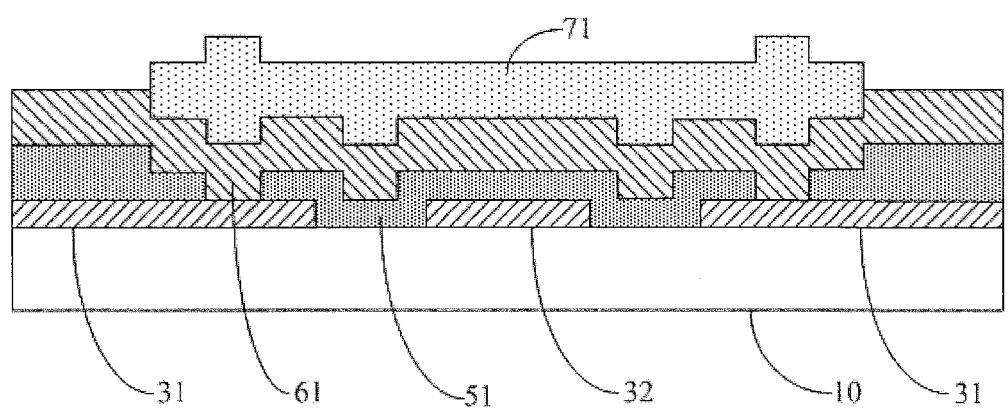

As shown in FIG. 7, a photoresist 71 is coated on the conductive layer 61. For example, the photoresist 71 in the embodiment of the present invention is a positive photoresist. In practice, the coated photoresist may also be a negative photoresist. The photoresist 71 in the embodiment is illustrated with reference to an example of a positive photoresist. When the positive photoresist is exposed through the mask 41 and developed, a portion of the positive photoresist that is irradiated by light is removed and a portion thereof that is not irradiated is remained during deveplopment. A portion of the photoresist 71 in a region corresponding to the fully transparent region 411 of the mask 41 is formed as a photoresist removed region, a portion of the photoresist 71 in a region corresponding to the partially transparent region 412 of the mask 41 is formed as a photoresist partially remained region, and a portion of the photoresist 71 in a region corresponding to the fully opaque region 413 of the mask 41 is formed as a photoresist fully remained region. As shown in FIG. 8, the photoresist fully remained region corresponds to a region where the conductive layer 61 is in contact with the first electrode 31, the photoresist partially remained region corresponds to the region where the bridging connection layer is needed to be formed and the photoresist removed region corresponds to a region on the substrate where no conductive layer is provided. The region where no conductive layer is provided is set as required by an actual product.

Figure 9:
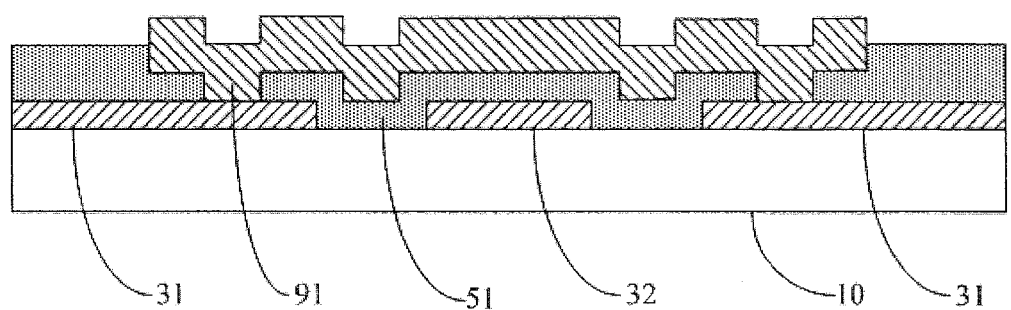

Next, as shown in FIG. 9, the conductive layer shown in FIG. 8 is etched, to remove the portion of the conductive layer in a region that is not covered by the photoresist 71. For example, in the embodiment of the present invention, the portion of the conductive layer in the region that is not covered by the photoresist 71 is removed through a wet etch, and then the photoresist is removed, producing the bridging connection layer 91.

In the embodiment of the present invention, the first organic film and the bridging connection layer in the touch-controlled panel are manufactured through one mask, which can reduce the number of the masks, simplify manufacturing process, increase producing efficiency and reduce producing cost compared with a conventional process in which two different masks are needed when manufacturing the first organic film and the bridging connection layer. In addition, the first organic film and the bridging connection layer can be aligned with each other more accurately as the same mask is used during manufacturing the first organic film and the bridging connection layer.

Figure 10:
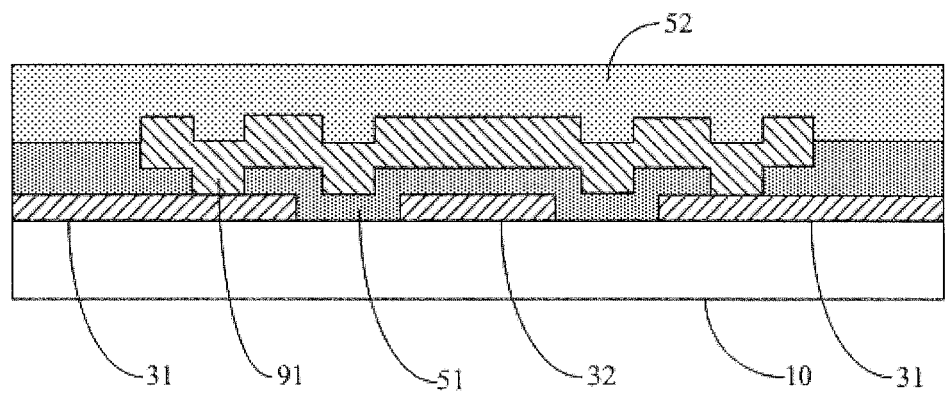

As shown in FIG. 10, the method of manufacturing the touch-controlled panel according to the embodiment of the present invention may further include forming a second organic film 52, through a patterning process, on the substrate, on which the first organic film 51 and the bridging connection layer 91 have been formed. The second organic film 52 can protect films below the second organic film 52.

In a still another embodiment of the present invention, which is similar to the above embodiments, however, the organic film 33 is made of a positive photoresist and the photoresist 71 is a negative photoresist.

Specifically, a portion of the organic film 33 formed by the positive photoresist, which is irradiated by light, is removed during development and a portion of the organic film 33, which is not irradiated by light, is remained during development. A portion of the photoresist 71 formed by the negative photoresist, which is irradiated by light, is remained during development and a portion of the photoresist 71, which is not irradiated by light, is removed during development. In such a way, the organic film is formed, by the same mask, as the organic film fully remained region, the organic film partially remained region and the organic film removed region. The organic film removed region corresponds to a region where the bridging connection layer is in contact with the first electrode or the second electrode, the organic film partially remained region corresponds to a region where the bridging connection layer is needed to be formed in a subsequent step, a portion of the organic film corresponding to the organic film fully remained region and the organic film partially remained region conditiutes the first organic film. The photoresist is formed as the photoresist fully remained region, the photoresist partially remained region and the photoresist removed region. The photoresist fully remained region corresponds to a region where the conductive layer is in contact with the first electrode or the second electrode, and the photoresist partially remained region corresponds to a region where the bridging connection layer is needed to be formed in a subsequent step.

Other steps are similar to those in the preceding embodiment and are not repeatedly described.

Embodiments of the present invention further provide a touch-controlled panel, which is obtained by using the above method. A specific structure of the touch-controlled panel is shown in FIG. 10.

Embodiments of the present invention further provide a display device, comprising the above mentioned touch-controlled panel. The display device may be a liquid crystal display panel, a liquid crystal display, a liquid crystal television, an organic light emitting diode (OLED) panel, an OLED display, an OLED television, or electronic paper, etc.

In sum, embodiments of the present invention provide a method of manufacturing a touch-controlled panel. The method comprises: forming a first electrode and a second electrode on a substrate through a patterning process, the first electrode and the second electrode being broken at a position where they are overlapped; depositing a layer of an organic film and forming an organic film fully remained region, an organic film partially remained region and an organic film removed region from the organic film through a mask, wherein the organic film removed region corresponds to a region where a bridging connection layer provided in a subsequent step is in contact with the first electrode or the second electrode, the organic film partially remained region corresponds to a region where the bridging connection layer is provided in a subsequent step, and a portion of the organic film corrsponding to the organic film fully remained region and the organic film partially remained region consititutes a first organic film; depositing a conductive layer and coating a photoresist on the conductive layer, and then forming a photoresist fully remained region, a photoresist partially remained region and a photoresist removed region through the mask, wherein the photoresist fully remained region corresponds to a region where the conductive layer is in contact with the first electrode or the second electrode, and the photoresist partially remained region corresponds to the region where the bridging connection layer will be provided in a subsequent step; etching the conductive layer where the above steps have been finished, and removing the residual photoresist, so as to form the bridging connection layer.

In the embodiments of the present invention, only one mask is needed during forming the first organic film and the bridging connection layer, which can reduce the number of the masks, simplify manufacturing process, increase producing efficiency and reduce producing cost compared with the conventional process in which two different masks are needed during manufacturing the first organic film and the bridging connection layer.

Based on the above embodiments of the present invention, those skilled in the art can obtain other embodiments of the present invention.

Obviously, it is obvious to modify and change the embodiments of the present invention without departing from inspirit and scope of the present invention. These modification and change to the embodiments of the present invention shall be covered in the scope of the present invention if they fall within the scope of the claims and equivalents.

The invention claimed is:

1. A method of manufacturing a touch-controlled panel, comprising:
    forming a first electrode and a second electrode on a substrate through a patterning process, both the first electrode and the second electrode being broken at a position where they are overlapped;
    depositing a layer of an organic film on the substrate on which the first electrode and the second electrode have been formed, and forming an organic film fully remained region, an organic film partially remained region and an organic film removed region from the organic film through a mask, wherein the organic film removed region corresponds to a region where a bridging connection layer provided in a subsequent step is in contact with the first electrode or the second electrode, the organic film partially remained region corresponds to a region where the bridging connection layer will be provided in a subsequent step, and a portion of the organic film corrsponding to the organic film fully remained region and the organic film partially remained region constitutes a first organic film;
    depositing a conductive layer and coating a photoresist on the conductive layer, and then forming a photoresist fully remained region, a photoresist partially remained region and a photoresist removed region through the mask, wherein the photoresist fully remained region corresponds to a region where the conductive layer is in contact with the first electrode or the second electrode, and the photoresist partially remained region corresponds to the region where the bridging connection layer will be provided;
    etching the conductive layer where the above steps have been finished, and removing the residual photoresist, so as to form the bridging connection layer.

2. The method as claimed in claim 1, wherein the first electrode and the second electrode are transparent electrodes; or the first electrode and the second electrode are metal electrodes.

3. The method as claimed in claim 2, wherein the conductive layer is a transparent conductive layer; or the conductive layer is a metal conductive layer.

4. The method as claimed in claim 3, wherein the substrate is a substrate of an array substrate;
- in a situation where the first electrode and the second electrode are transparent electrodes, the first electrode and the second electrode are formed in the same layer as a pixel electrode, or are formed in the same layer as a common electrode; and
- in a situation where the first electrode and the second electrode are metal electrodes, the first electrode and the second electrode are formed in the same layer as a gate electrode, or are formed in the same layer as source and drain electrodes.

5. The method as claimed in claim 3, wherein the substrate is a substrate of an array substrate;
- in a situation where the conductive layer is a transparent conductive layer, the conductive layer is formed in the same layer as a pixel electrode, or is formed in the same layer as a common electrode; and
- in a situation where the conductive layer is a metal conductive layer, the conductive layer is formed in the same layer as a gate electrode, or is formed in the same layer as source and drain electrodes.

6. The method as claimed in claim 1, wherein the organic film is formed of a negative photoresist and the photoresist is a positive photoresist; or, the organic film is formed of a positive photoresist and the photoresist is a negative photoresist.

7. The method as claimed in claim 6, wherein the mask is a gray-tone mask or a half-tone mask.

8. The method as claimed in claim 7, further comprising: forming a second organic film, through a patterning process, on the substrate on which the first organic film and the bridging connection layer have been formed.

\* \* \* \* \*